United States Patent [19]

DeBrosse et al.

[11] Patent Number: 5,691,946

[45] Date of Patent: Nov. 25, 1997

[54] ROW REDUNDANCY BLOCK ARCHITECTURE

[75] Inventors: John DeBrosse, Burlington, Vt.; Toshiaki Kirihata, Wappingers Falls, N.Y.; Hing Wong, Norwalk, Conn.

[73] Assignee: International Business Machines Corporation, Armonk, N.Y.

[21] Appl. No.: 758,783

[22] Filed: Dec. 3, 1996

[51] Int. Cl.$^6$ .................................................. G11C 5/06
[52] U.S. Cl. .................................... 365/200; 365/63
[58] Field of Search ............................ 365/200, 51, 63, 365/72, 230.03

[56] References Cited

U.S. PATENT DOCUMENTS

| | | | |
|---|---|---|---|
| 4,047,163 | 9/1977 | Choate et al. | 364/900 |
| 4,051,354 | 9/1977 | Choate | 364/900 |
| 4,228,528 | 10/1980 | Cenker et al. | 365/200 |
| 4,586,170 | 4/1986 | O'Toole et al. | 365/200 |
| 4,922,128 | 5/1990 | Dhong et al. | 307/269 |
| 5,046,046 | 9/1991 | Sweha et al. | 365/200 |
| 5,134,616 | 7/1992 | Barth, Jr. et al. | 371/10.3 |
| 5,268,866 | 12/1993 | Feng et al. | 365/200 |
| 5,414,659 | 5/1995 | Ito | 365/200 |
| 5,422,850 | 6/1995 | Sukegawa et al. | 365/200 |
| 5,517,442 | 5/1996 | Kirihata et al. | 365/51 |
| 5,625,603 | 4/1997 | McClure et al. | 365/230.03 |

OTHER PUBLICATIONS

W. Cordaro et a,l "Sense Latch Triggering Circuit", IBM Technical Disclosure Bulletin, vol. 26 No. 10B, Mar. 1984.
"Word Line Detector Circuit", IBM Technical Disclosure Bulletin, vol. 29 No. 6, Nov. 1986.
"Fast DRAM Sensing With Sense Amplifiers Synchronous to Bitline Delays", IBM Technical Disclosure Bulletin, vol. 29 No. 10 Mar. 1987.
"Multiplexed Column Redundancy Method for Complementary Metal Oxide Silicon Memory", IBM Disclosure Bulletin, vol. 31 No. 10 Mar. 1989.

*Primary Examiner*—David C. Nelms
*Assistant Examiner*—Son Mai
*Attorney, Agent, or Firm*—Whitham, Curtis, Whitham & McGinn; H. Daniel Schnurmann

[57] ABSTRACT

Row redundancy control circuits which effectively reduce design space are arranged parallel to word direction and are arranged at the bottom of the redundancy block. This architecture change makes it possible to effectively lay out the redundancy control block by introducing (1) split-global-bus shared with local row redundancy wires, (2) half-length-one-way row redundancy-wordline-enable-signal wires which allows space saving, and (3) distributed wordline enable decoders designed to take advantage of the saved space. An illegal normal/redundancy access problem caused by the address versus timing skew has also been solved. The timing necessary for this detection is given locally by using its adjacent redundancy match detection. This allows the circuit to operate completely as an address driven circuit, resulting in fast and reliable redundancy match detection. In addition, a sample wordline enable signal (SWLE) is generated by using row redundancy match detection. One two-input OR gate allows the time at which SWLE sets sample wordline (SWL) to be the same as the time at which wordline enable (WLE) signal sets wordline (WL). The time at which SWLE sets SWL remains consistent regardless of mode, eliminating the existing reliability concern. This two-input OR gate combined with row redundancy match detection works as an ideal sample wordline enable generator.

17 Claims, 12 Drawing Sheets

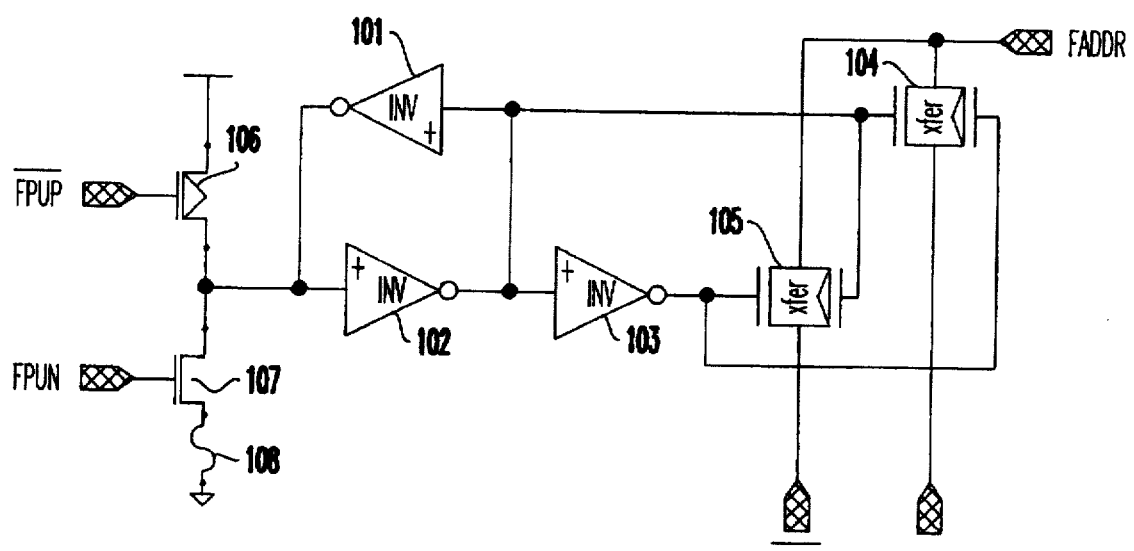
FIG.10
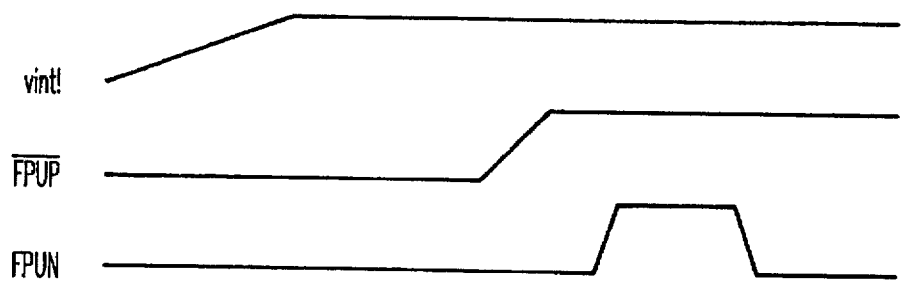
FIG.11
Operation
| Fuse | FADDR |
|---|---|
| Exist | ADDR |
| Blown | $\overline{ADDR}$ |
FIG.12

ROW REDUNDANCY BLOCK ARCHITECTURE

BACKGROUND OF THE INVENTION

1. Field of the Invention

The present invention generally relates to semiconductor memories and, more particularly, to row redundancy match detection with interchanged self-timing generator, a sample wordline enable generator with row redundancy match detection, and row redundancy control circuits for Dynamic Random Access Memory (DRAM) redundancy block architecture.

2. Background Description

Redundancy block architecture for DRAMs, proposed by H. L. Kalter et al. in "A 50-ns 16-Mb DRAM with 10-ns Data Rate and On-chip ECC", *IEEE J. Solid-State Circuits*, vol. 25, no. 5, October 1990, features flexible row redundancy replacement. This flexibility is advantageous because it allows redundancy elements and redundancy match-detection-decoders to be effectively used without increasing their number. This reduces the redundancy design space overhead significantly, especially for high density DRAMs such as 256-Mb DRAMs and beyond, while allowing good fault repairability.

In contrast to conventional intra-block redundancy replacement, redundancy block architecture is required to handle more redundancy match-detection-decoders "simultaneously", although the total number of redundancy requirements is significantly less. This is because of the flexibility of this architecture. It is very important to arrange the decoders effectively and to enable a fast and reliable redundancy match detection to avoid a potential speed and area penalty for the actual implementation.

SUMMARY OF THE INVENTION

It is therefore an object of the present invention to provide a redundancy block architecture which uses a row redundancy control circuit arrangement that effectively reduces design space.

It is a further object of the invention to provide a fast and reliable redundancy match detection by means of a NOR type redundancy match detection with an interchanged self-timing generator.

It is another object of the invention to provide a sample wordline enable (SWLE) generator which allows SWLE to set the sample wordline (SWL) at a time when wordline enable (WLE) sets the wordline (WL) regardless of normal or redundancy mode, while tracking the delay for the redundancy match detection.

The present invention is related to the invention disclosed in U.S. Pat. No. 5,517,442 to Kirihata et al., the subject matter of which is incorporated herein by reference. According to the present invention, row redundancy control circuits are arranged parallel to word direction and are arranged at the bottom of the redundancy block. This architecture change makes it possible to effectively lay out the redundancy control block by introducing (1) split-global-bus shared with local row redundancy wires, (2) half-length-one-way row redundancy-wordline-enable-signal wires which allows space saving, and (3) distributed wordline enable decoders designed to take advantage of the saved space. According to another aspect of the invention, an illegal normal/redundancy access problem caused by the address versus timing skew has been solved. The timing necessary for this detection is given locally by using its adjacent redundancy match detection. This allows the circuit to operate completely as an address driven circuit, resulting in fast and reliable redundancy match detection. In addition, a sample wordline enable signal (SWLE) is generated by using row redundancy match detection. One two-input OR gate allows the time at which SWLE sets sample wordline (SWL) to be the same as the time at which wordline enable (WLE) signal sets wordline (WL). The time at which SWLE sets SWL remains consistent regardless of mode, eliminating the existing reliability concern. This two-input OR gate combined with row redundancy match detection works as an ideal sample wordline enable generator.

In general, the purposes of the present invention are the following:

Provide an ideal arrangement for redundancy-match-detection-decoders to reduce the design space.

Allow fast and reliable redundancy-match-detection.

Realize a fast and reliable sample wordline enable generator using redundancy-match-detection post decoders.

BRIEF DESCRIPTION OF THE DRAWINGS

The foregoing and other objects, aspects and advantages will be better understood from the following detailed description of a preferred embodiment of the invention with reference to the drawings, in which:

FIG. 10 is a circuit diagram of the fuse latch (FLAT) circuit;

FIG. 11 is a timing diagram showing the operation of the FLAT on power-up;

FIG. 12 is a table showing the operation of the FLAT for the conditions of existing and blown fuses;

DETAILED DESCRIPTION OF PREFERRED EMBODIMENTS OF THE INVENTION

Figure 1:
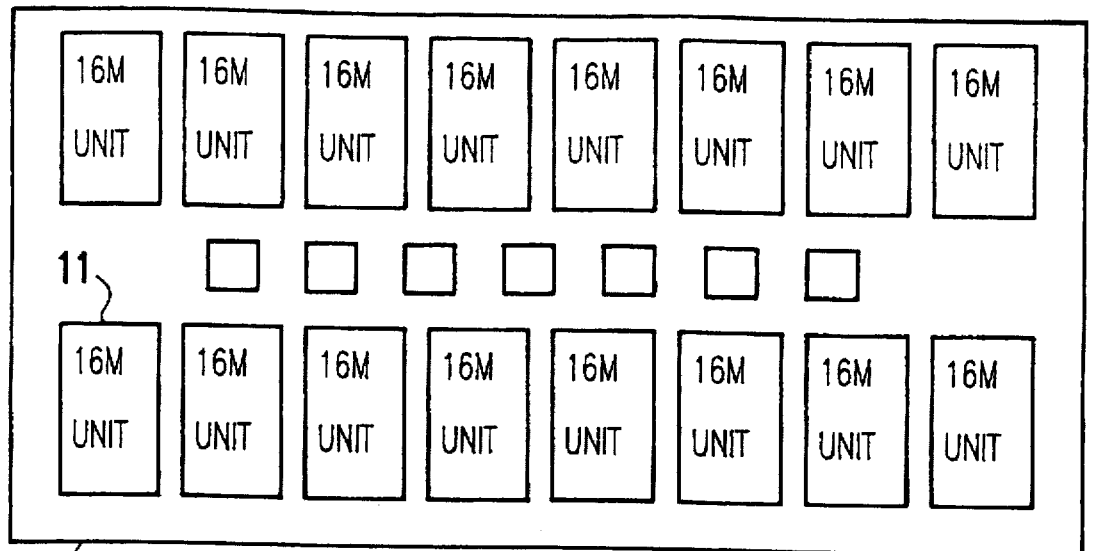
FIG. 1 is a block diagram of a 256-Mb DRAM.
Figure 2:
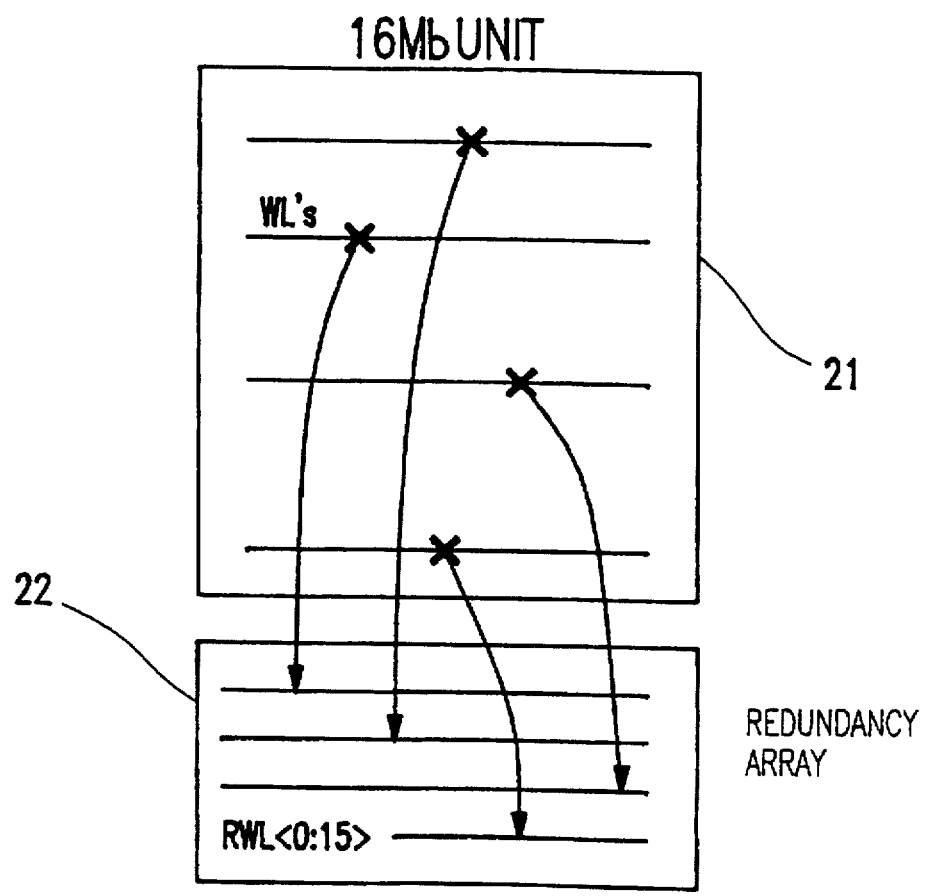
FIG. 2 is a block diagram of a single 16-Mb unit of the 256-Mb DRAM shown in FIG. 1.

Referring now to the drawings, and more particularly to FIG. 1, there is shown a 256-Mb DRAM 10. This architecture is comprised of sixteen 16-Mb units 11, one of which is shown in more detail in FIG. 2. Each 16-Mb unit is divided into two arrays, the primary array 21 containing 256 wordlines (WLs) and a redundant array 22 containing 16 redundant wordlines (RWLs). The redundant array 22 allows the repair of up to sixteen faults, using sixteen row redundancy (RRDN) control circuits as shown in more detail in FIG. 3, where a wordline (WL) and redundancy wordlines (RWLi) are set by a wordline enable (WLE) signal and the corresponding redundancy wordline enable signal (RWLEi), respectively. In a standby state, WLE and RWLE are both low, and the N nodes are all high. In a normal mode, all the N nodes go low, enabling WLE (i.e., WLE goes high). In a redundancy mode, one RWLE goes high, and the corresponding node N stays at a high level, not enabling WLE (i.e., WLE stays at a low level). The more detailed operations to control WLE and RWLEs are described below.

Each row redundancy (RRDN) control circuit 31 compares the row addresses (ADDRs) with its programmed fuse states and activates either corresponding node Ni or RWLEi signal. A sixteen input NOR gate decoder 32 receives the outputs from the nodes Ni. When at least one address in an RRDNi control circuit 31 does not match its programmed fuse state, the signal at the corresponding node Ni falls, while keeping the corresponding RWLEi at a low level. When all ADDRs match its RRDN programmed fuse states, the corresponding RWLEi signal rises, but a corresponding node Ni remains at high level. If all nodes Ni from RDDNs fall, WLE rises, which is a normal mode. If one node Ni remains high, WLE remains low, which is a redundancy mode. In this redundancy mode, the corresponding RWLEi rises, activating the corresponding redundancy wordline RWLi.

The architecture requires one WLE signal, sixteen RWLE<0:15> signals, and sixteen N<0:15> signals for the outputs from RRDNs 31. Twenty address wires for possible 1K replacement are also required. In general, RRDN circuit design space is determined by the number of wires, because devices can be designed under the wires and the wiring space is more than sufficient. The architecture requires at least fifty-two wires (in addition to the necessary control signal and power lines), resulting in a minimum 156 μm (52 μm×3) design space, assuming a wiring pitch of 3 μm. According to a first aspect of the invention, a solution is provided which effectively reduces additional design space for the redundancy control circuits to only 27 μm.

Figure 4:
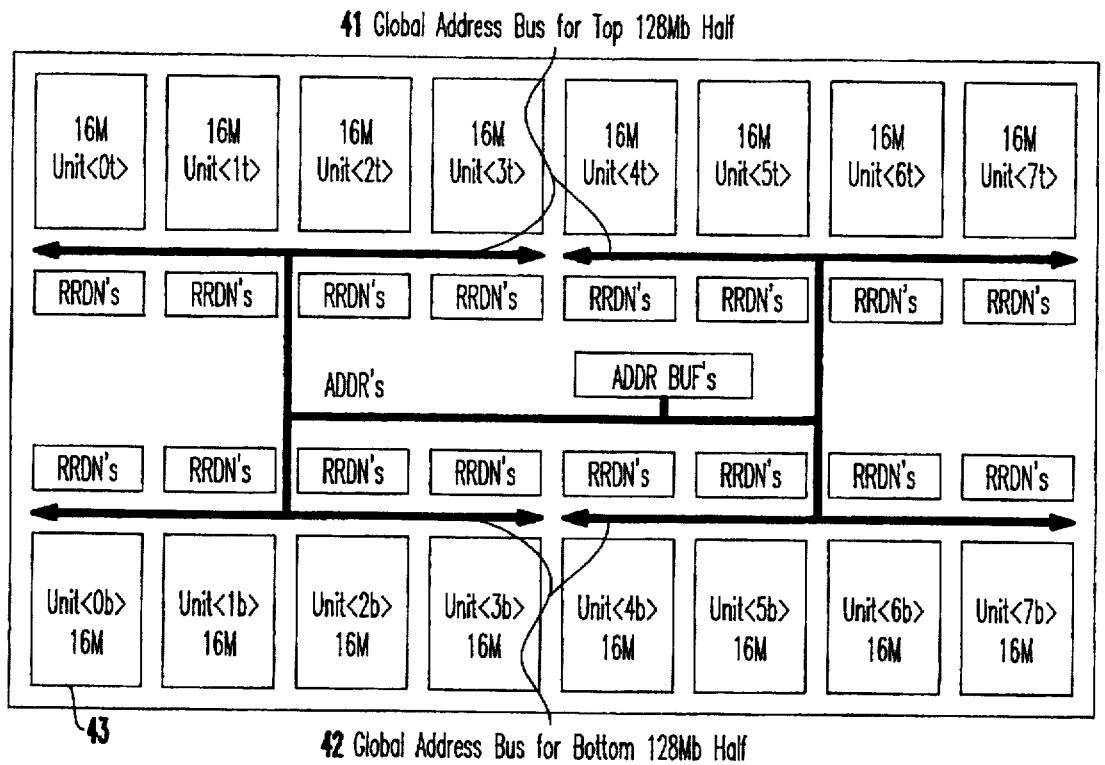
FIG. 4 is a block diagram of the split global bus architecture used in the preferred embodiment of the invention.
Figure 5:
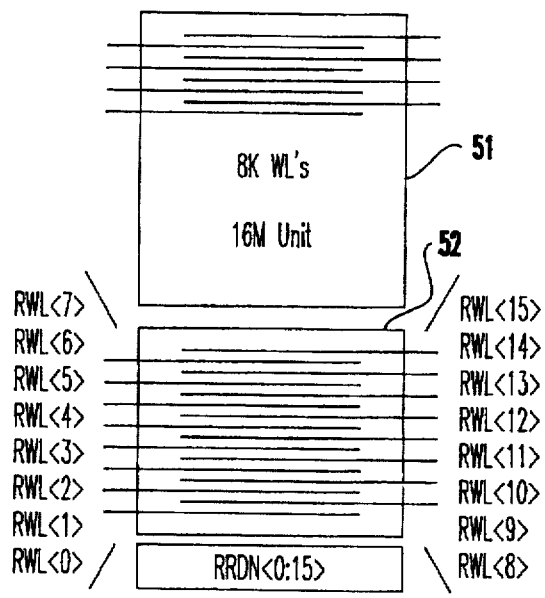
FIG. 5 is a block diagram of a 16-Mb unit used in the architecture shown in FIG. 4 showing the locations of the wordlines (WLs) and redundant wordlines (RWLs)

FIG. 4 shows a split global bus architecture as disclosed in U.S. Pat. No. 5,517,442 to Kirihata et al. which is assumed for the present invention. In this architecture, each top/bottom 128 -Mb half of the chip has an independent global address bus 41 and 42, respectively. The 256-Mb DRAM consists of sixteen 16-Mb units 43, one of which is shown in more detail in FIG. 5. The 16-Mb unit consists of 8K wordlines (Wls). Any defective element in the unit is replaceable by any of sixteen redundancy wordlines (RWL<0:15>) in the redundancy block 52. The WLs and RWLs are alternatively driven from the left and right wordline drivers. Sixteen row redundancy (RRDN<0:15>) control circuits 53 are arranged at the bottom of each 16-Mb unit.

Figure 6:
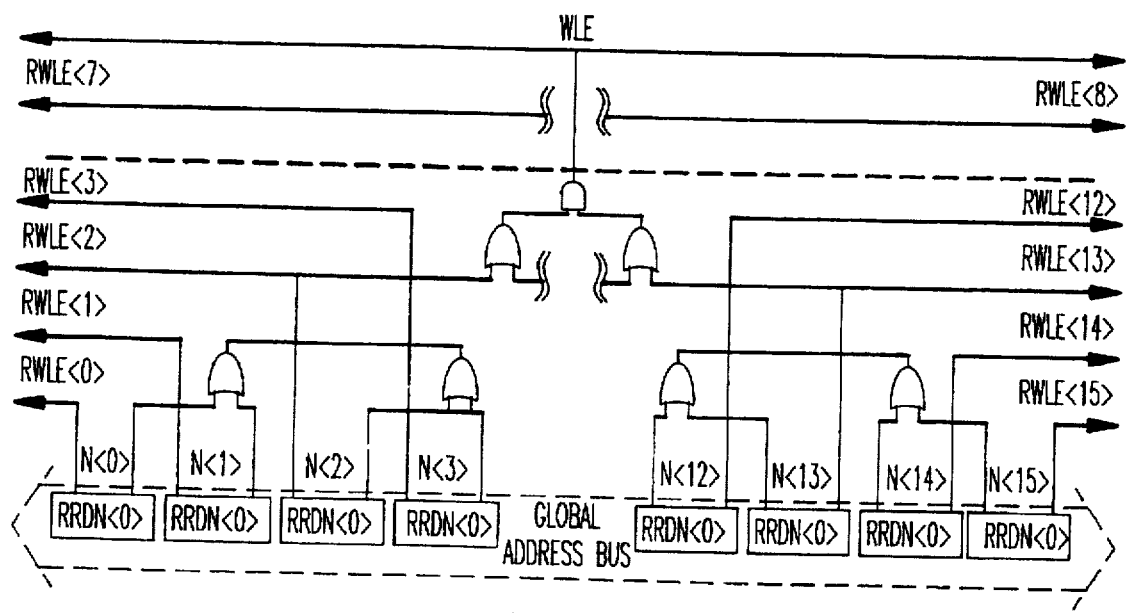
FIG. 6 is a block and logic diagram showing the RRDN and wiring arrangement of the 16-Mb unit of FIG. 5.

FIG. 6 shows the detailed RRDN circuit 53 and wiring arrangement for the invention. More particularly, the invention provides a row redundancy control circuit arrangement which effectively reduces design space. This reduction is achieved by (1) split global-address-bus shared with local row-redundancy wires, (2) half-length-one-way redundancy-enable wires for double-sided row decoder, and (3) distributed wordline enable decodes.

(1) Split global address bus shared with row redundancy local wires: The local address wires are shared with level two metal (M2) split global bus lines as described in U.S. Pat. No. 5,517,442 to Kirihata et al. RRDN circuits are laid out under the wires. This eliminates the necessity for the twenty address wires and devices for RRDN circuits, while shortening the address input wires for the RRDN circuits from the global bus lines.

(2) Half-length-one-way redundancy-enable wires for double-sided row decoder: The eight row redundancy (RRDN<0:7>) circuits designed in the left half unit controls the corresponding eight redundancy wordlines (RWL<0:7>) which are driven from the left drivers. The other eight row redundancy (RRDN<8:15>) circuits in the right half unit control the corresponding eight redundancy wordlines (RWL<8:15>) which are driven from the right drivers. This allows the maximum number of parallel redundancy wordline enable (RWLE<0:15>) wires to be halved.

(3) Distributed wordline enable decoders: The 16-input NOR decoders (32 in FIG. 3) which generate the signal WLE are distributed. The wires (N<0:15>) for the inputs to the distributed NOR gates are laid out in the unused space for the redundant wordline enable (RWLE<0:15>) lines. This results in the design space reduction for sixteen (N<0:15>) wires. The WLE signal is connected to both side WL drivers.

Figure 7:
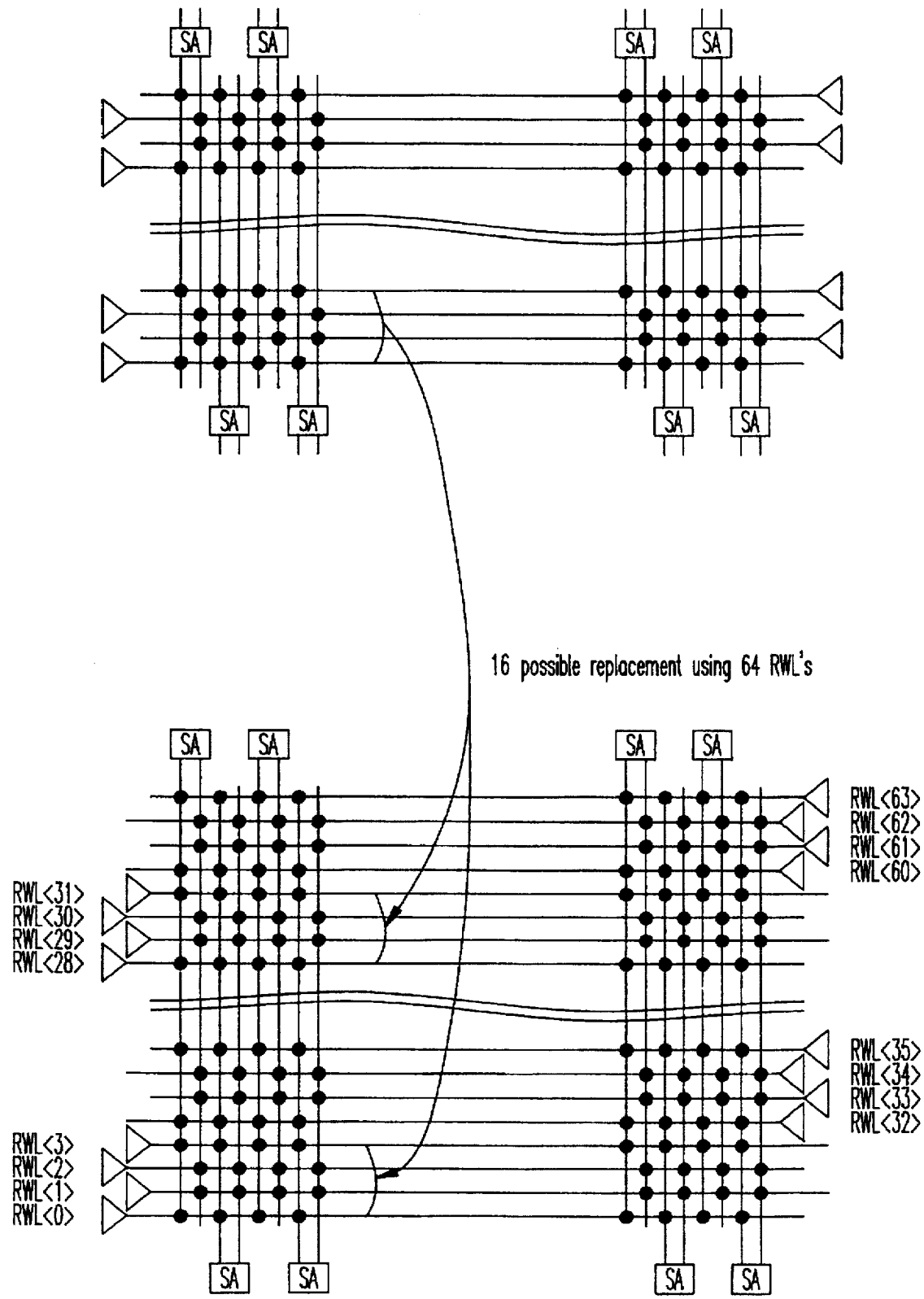
FIG. 7 is wiring diagram showing a RWL arrangement for multi-WL replacement according to the invention.

This description assumes a single WL replacement; however, the invention could be applied for a multi-wordline replacement. FIG. 7 shows a RWL arrangement for the multi-wordline replacement. If one of four WLs are defective, they are replaced with four corresponding RWLs. In order to allow up to a possible sixteen replacements, sixty-four RWLs are laid out in the redundancy block. Four consecutive RWLs act as a group and are used to replace four consecutive WLs when one of them is defective. Unlike the single RWL replacement, four consecutive redundant wordlines (RWL<4i:4i+3>) are controlled by one corresponding redundant word line enable (RWLE<i>) signal and are driven from the same side of the unit. Each adjacent four consecutive RWL group are driven from the other side of the unit.

Figure 3:
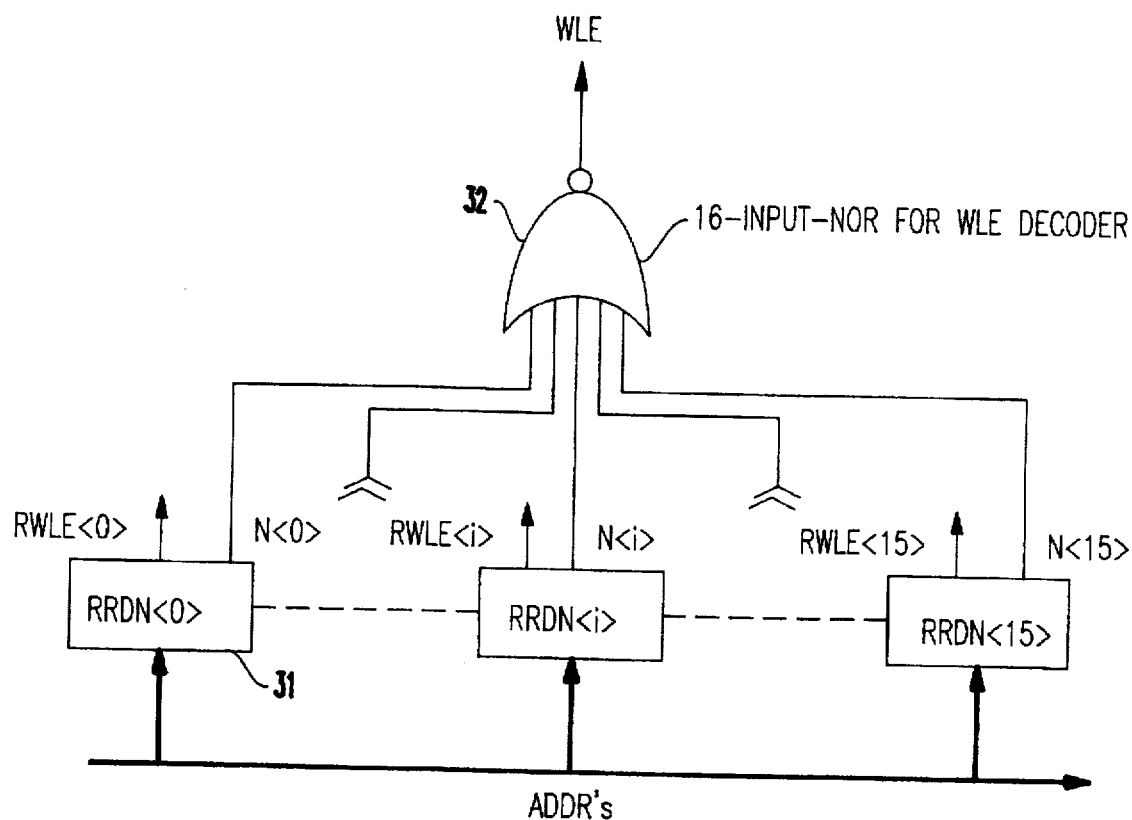
FIG. 3 is a block and logic diagram of the sixteen row redundancy (RRDN) control circuits and a 16-input NOR gate used in the 16-Mb unit shown in FIG. 2.
Figure 8:
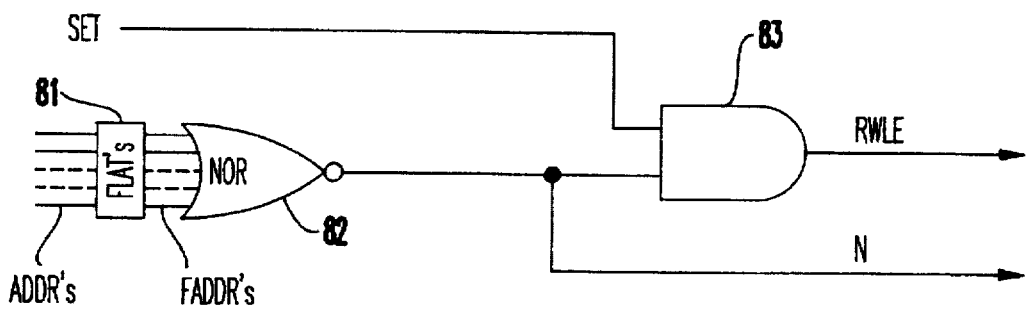
FIG. 8 is a block and logic diagram of a row redundancy (RRDN) control circuit.
Figure 9:
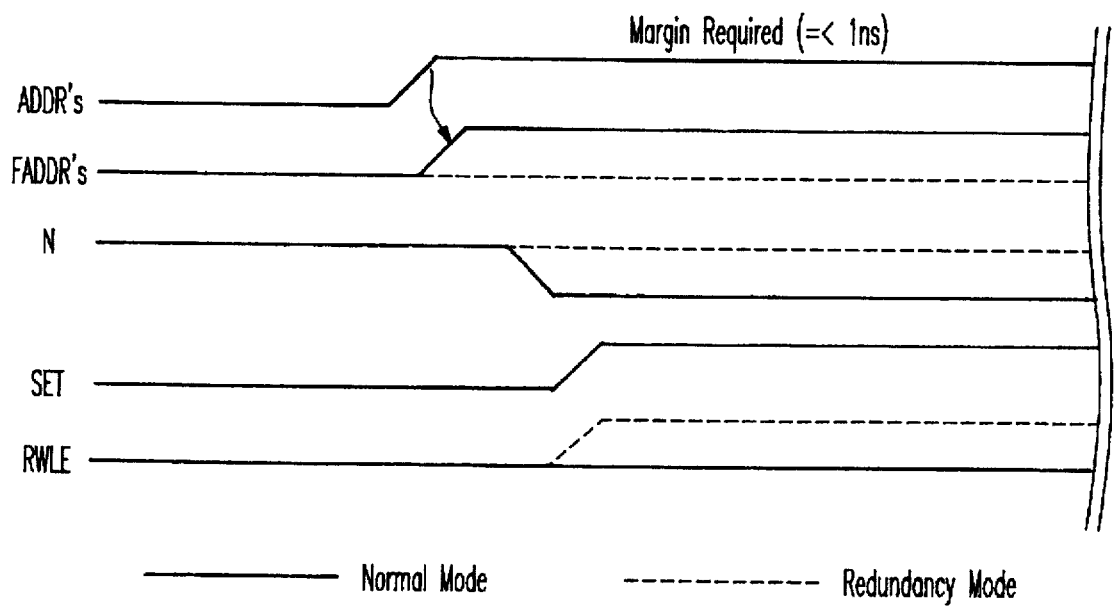
FIG. 9 is a timing diagram showing the operation of the RRDN of FIG. 8 in normal and redundancy modes.

FIG. 8 shows a detailed circuit of the redundancy match detection decoder (RRDN) 31 in FIG. 3. It consists of fuse latches (FLATs) 81 and a NOR gate decoder 82. As shown in FIG. 9, signal FADDR rises if the address ADDR does not match the programmed fuse state. As described above, the node N falls in normal mode, because at least one FADDR goes high. This disables RWLE activation even when signal SET rises. In a redundancy mode, the node N remains high, activating RWLE output and AND gate 83 when SET rises.

FIG. 10 shows a detail of the fuse latch (FLAT) in FIG. 9, which acts as an address/fuse comparator. The complementary metal oxide semiconductor (CMOS) latch is comprised of a pair of cross-coupled inverters 101 and 102 providing complementary outputs (via inverter 103) to transfer gates 104 and 105. The latch is set in chip power-up phase by signals $\overline{FPUP}$ and FPUN at the gates of PFET 106 and NFET 107, respectively, as shown in the timing diagram of FIG. 11. ADDR and $\overline{ADDR}$ are true and complement row addresses, respectively. Both ADDR and $\overline{ADDR}$ are low in a standby state. Either ADDR or $\overline{ADDR}$ rises when RAS falls (i.e., $\overline{ADDR}$ rises when the address is "0" and ADDR rises when the address is "1"). If a fuse 108 exists ("0" State), FADDR follows ADDR. FADDR, on the other hand, follows $\overline{ADDR}$ if the fuse is blown ("1" state).

The following discussion assumes that a programmed address is a "0" if the fuse is not blown and a "1" if the fuse is blown. FADDR accordingly rises when the address does not match the programmed fuse state (address/fuse unmatch detection). If ADDR and $\overline{ADDR}$ are swapped, FADDR rises when the address matches the programmed fuse state (address/fuse match detection). One FLAT is required for each address. In order to allow 1K possible replacement per array, ten FLATs are required.

Figure 13:
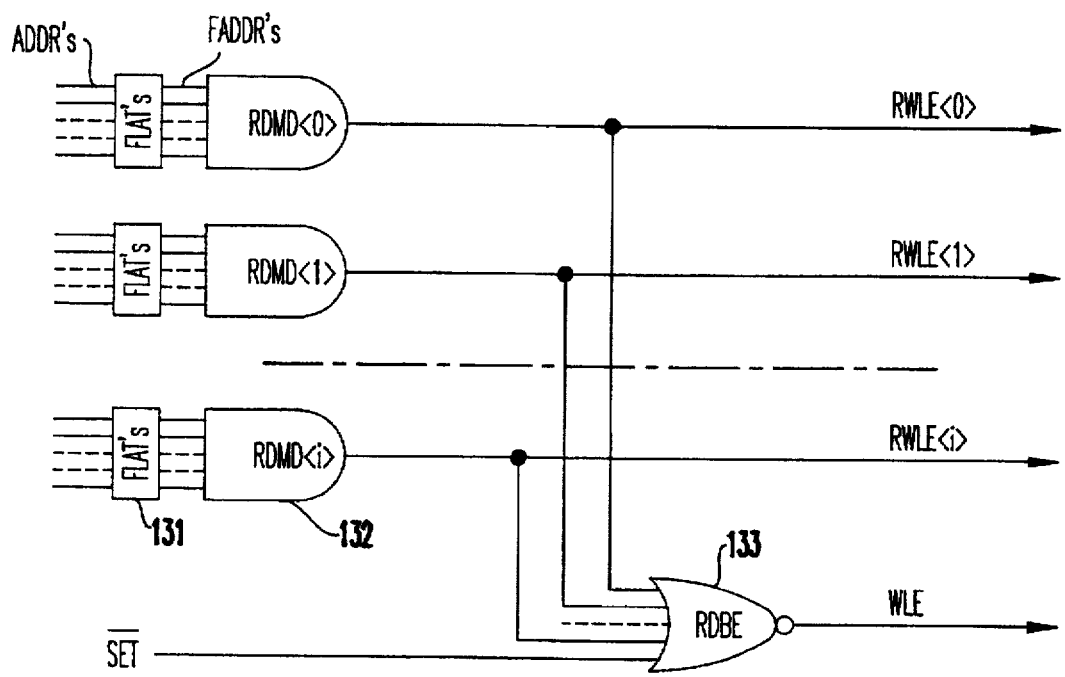
FIG. 13 is a logic diagram of an AND type redundancy match detection circuit.
Figure 14:
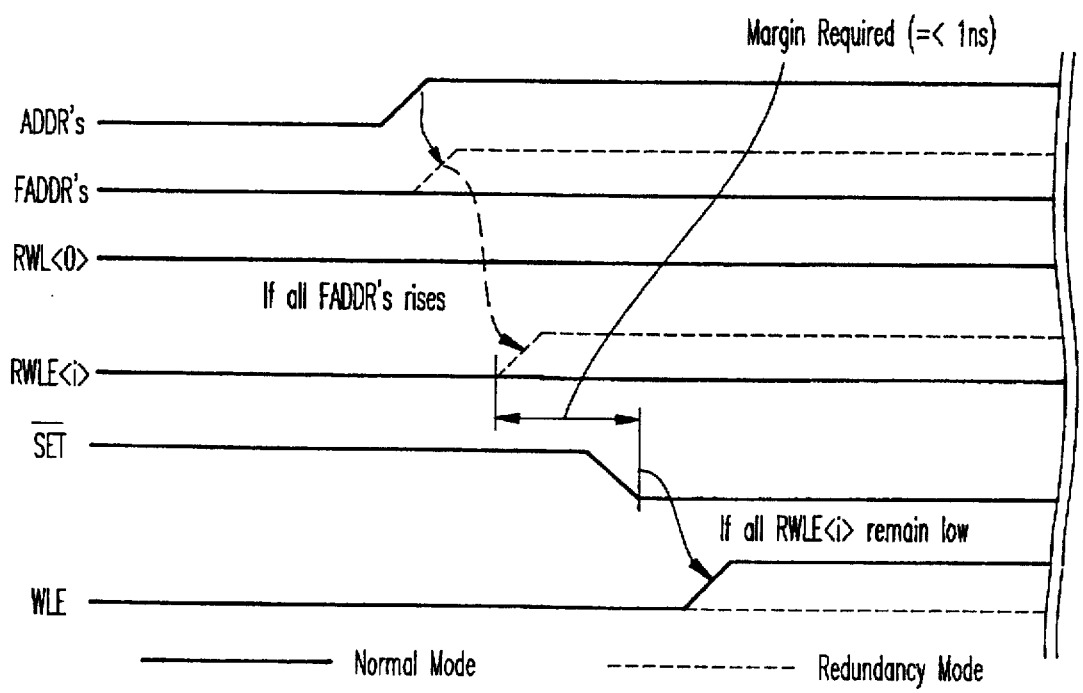
FIG. 14 is a timing diagram showing the operation of the circuit of FIG. 13.

According to another aspect of the invention, there is provided a row redundancy match detection circuit with interchanged self-timing generator that eliminates an illegal normal/redundancy access problem caused by the address versus time skew. In general, there are two approaches for the redundancy match detection; AND and NOR type. The match detection decoder illustrated in FIG. 8 is the NOR type. Conventional AND type and NOR type decoder operations are discussed next. FIG. 13 shows a row redundancy (RRDN) match detection circuit using AND gates 132, where a signal FDDR is an output from a fuse latch circuit (FLAT) 131. As shown in FIG. 14, signal FADDR rises if the corresponding address ADDR matches the programmed fuse state. A redundancy match detection RDMD<i> decodes all its FADDRs and controls its corresponding redundancy-wordline-enable signal RWLE<i>. Signal RWLE<i> will rise only when all its FADDRs are high (all input ADDRs match the programmed fuse states for its corresponding FLATs). A wordline-enable signal (WLE) from NOR gate 133, which activates a normal wordline (WL), will be enabled only if all RWLEs remain low. If one RWLE<i> rises, the corresponding redundancy-wordline will be enabled. In this case, the normal will not be enabled, because one RWLE<i> is high when the signal $\overline{SET}$ falls.

In this AND redundancy match detection, the timing for RWLE<i> is automatically generated by the ADDR transition (FADDRs are generated by ADDRs). The signal $\overline{SET}$, however, must set the signal WLE. In order to avoid an illegal WLE activation, the time that $\overline{SET}$ falls must be later than the time that RWLE<i> rises. Although the time that $\overline{SET}$ falls could be determined according to the simulation results, it must be sufficiently delayed to avoid illegal WLE activation, resulting in a slow operation.

Figure 15:
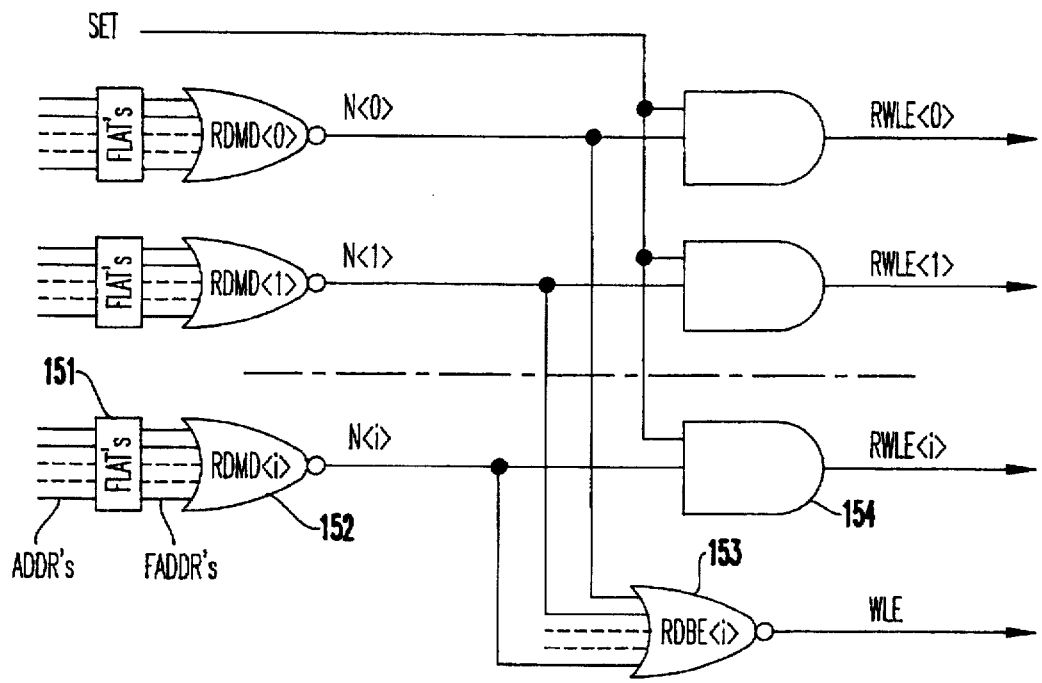
FIG. 15 is a logic diagram, similar to FIG. 8, of a NOR type redundancy match detection circuit.
Figure 16:
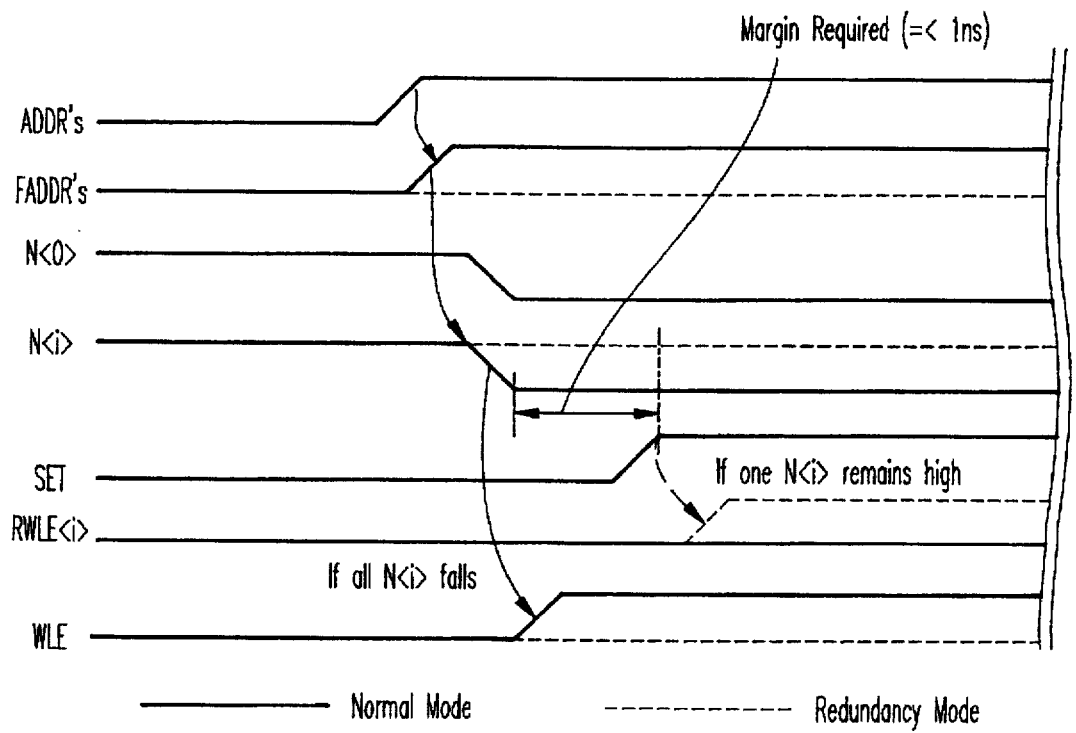
FIG. 16 is a timing diagram showing the operation of the circuit of FIG. 15.

FIG. 15 shows a redundancy match detection using NOR gates 152. As shown in FIG. 16, signal FADDR rises if its corresponding ADDR does not match the programmed fuse state. RDMD<i> decodes all its FADDRs and controls its corresponding RWLE<i>. In a normal mode, all nodes N<i> fall when signals ADDR arrive, activating WLE. A node N<i> remains high only when all its FADDRs remain low (i.e., all input ADDRs match the programmed fuse states). In this case, the corresponding RWLE<i> AND gate 154 will be enabled when the signal SET rises. WLE output by NOR gate 153 remains low in the redundancy mode, because the N<i> remains high, disabling the normal mode.

In this NOR type redundance match detection, the timing for WLE is automatically generated by FADDRs (note that FADDRs are generated by ADDRs). The signal SET, however, must set the signal RWLE<i>. In order to avoid an illegal RWLE<i> activation, the time that SET rises must be later than the time that a node N<i> falls. Although the time that SET rises would be determined according to the simulation results, it must be sufficiently delayed in order to avoid illegal RWLE<i> activation, resulting in slow operation.

There is a requirement to design a fast and reliable row redundancy match detection. The existing detections described above require timing for either WLE or RWLE, resulting in an access speed penalty. The access speed penalty would be increased for the high density DRAMs (e.g., 256-Mb DRAMs), because the DRAMs must handle many row redundancy (RRDN) contact circuits and the SET and $\overline{SET}$ timing must be sufficiently delayed for all RRDN circuits. The invention allows a fast and reliable redundancy match detection by means of a NOR type redundancy match detection with an interchanged self-timing generator.

Figure 17:
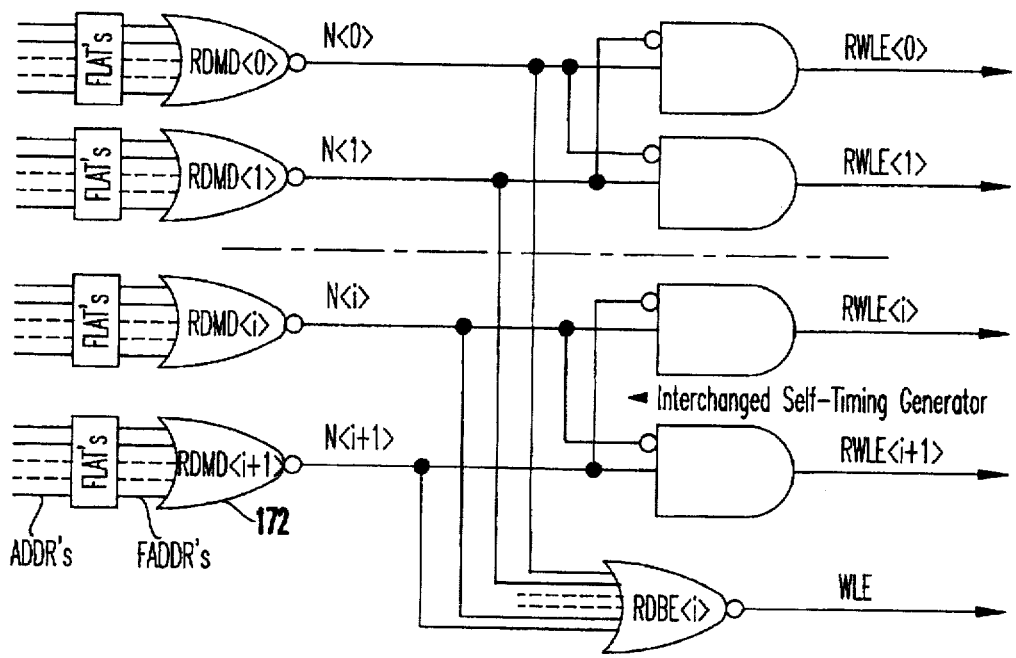
FIG. 17 is a logic diagram of a NOR type redundancy match detection circuit with interchanged self-timing generator.
Figure 18:
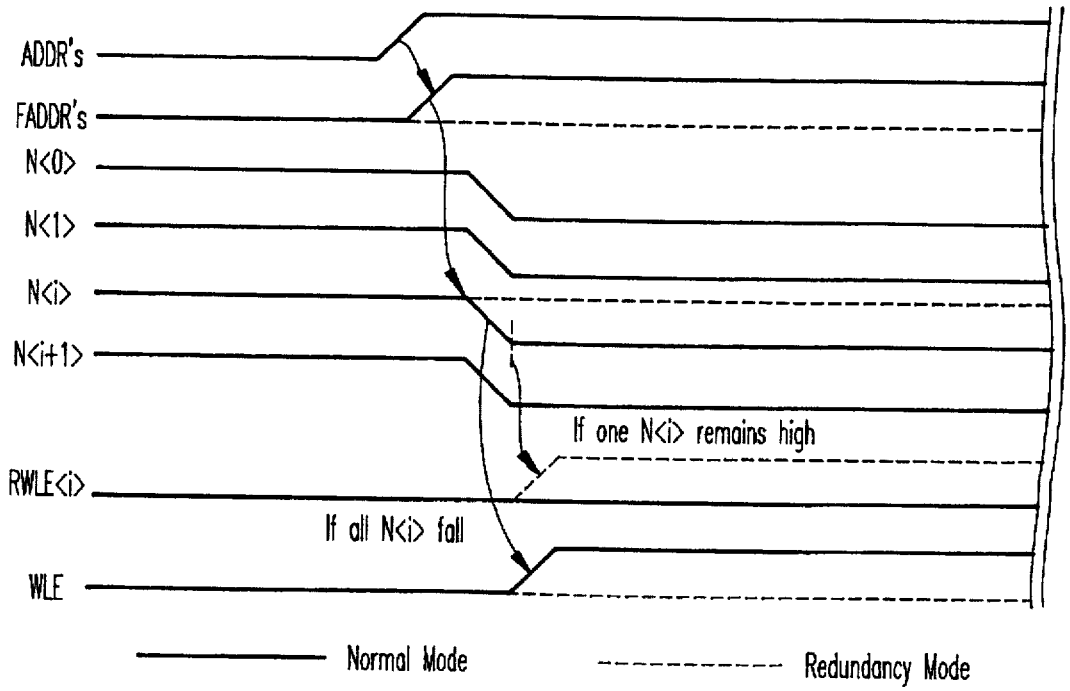
FIG. 18 is a timing diagram showing the operation of the circuit of FIG. 17.

FIG. 17 shows a redundancy match detection using NOR gates 172, where N<i> generated by RDMD<i> is interchanged with the N<i+1> (which is generated by its adjacent RDMD<i+1>. N<i> is a timing signal for setting RWLE<i+1>. N<i+1> is a timing signal for setting RWLE<i>. Note that RDMD<i> and RWLE<i+i> cannot detect the redundancy mode simultaneously and cannot activate two RWLE<i> and RWLE<i+i>, because only one redundancy wordline at a time can be accessed in one array. As shown in FIG. 18, FADDR rises if the corresponding ADDR does not match the programmed fuse state. A NOR RDMD<i> decodes all its FADDRs and controls its corresponding RWLE<i>. In a normal mode, all nodes N<i> fall when FADDRs arrive, activating WLE. A node N<i> remains high only when all its FADDRs remain low (i.e., all input ADDRs for the corresponding FLATs match the programmed fuse states). In this case, N<i+1> generated by the adjacent RDMD<i+1> falls, activating the corresponding RWLE<i>. WLE remains low in the redundancy mode, because the N<i> remains high, disabling the normal mode.

The redundancy match detection is accomplished completely as an address driven circuit. No special timing generator is necessary. The adjacent RDMD<i+i> acts as a timing generator. The timing skew between N<i> and N<i+1> would be very small, because RDMD<i+1> uses the exact same layout of the RDMD<i> and is implemented near RDMD<i+1>. Almost no additional margin is required, resulting in a very fast and reliable redundancy match detection. According to another aspect of the invention, a sample wordline enable (SWLE) generator is provided which allows SWLE to set sample wordline (SWL) at a time when wordline enable (WLE) signal sets the wordline (WL) regardless of normal or redundancy mode, while tracking the delay for the redundancy match detection. As before, the following discussion assumes a redundancy array architecture which allows the repair of up to sixteen faults in a 16-Mb DRAM, using sixteen row redundancy (RDDN<0:15>) control circuits as shown in FIG. 4. It is further assumed that wordline (WL), redundancy wordlines (RWL<0:15>), and sample wordline (SWL) are set by the wordline enable (WLE) signal, the redundancy wordline enable (RWLE<0:15>) signal, and the sample wordline enable (SWLE) signal, respectively.

Each RDDN compares the row addresses ADDR with its programmed fuse states, and activates either corresponding N or RWLE signals. When a RRDN detects a normal mode (at least one address does not match its programmed fuse state), N falls. When RRDN detects a redundancy mode (all ADDRs match their RRDN programmed fuse states), the corresponding RWLE rises. WLE rises only when all sixteen Ns fall, as shown in FIG. 3.

Figure 19:
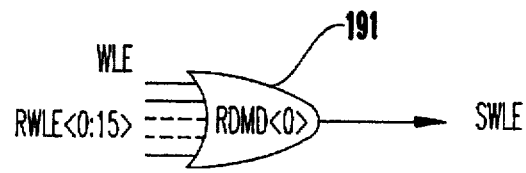
FIG. 19 is a logic diagram of an existing sample wordline enable (SWLE) generator.
Figure 20:
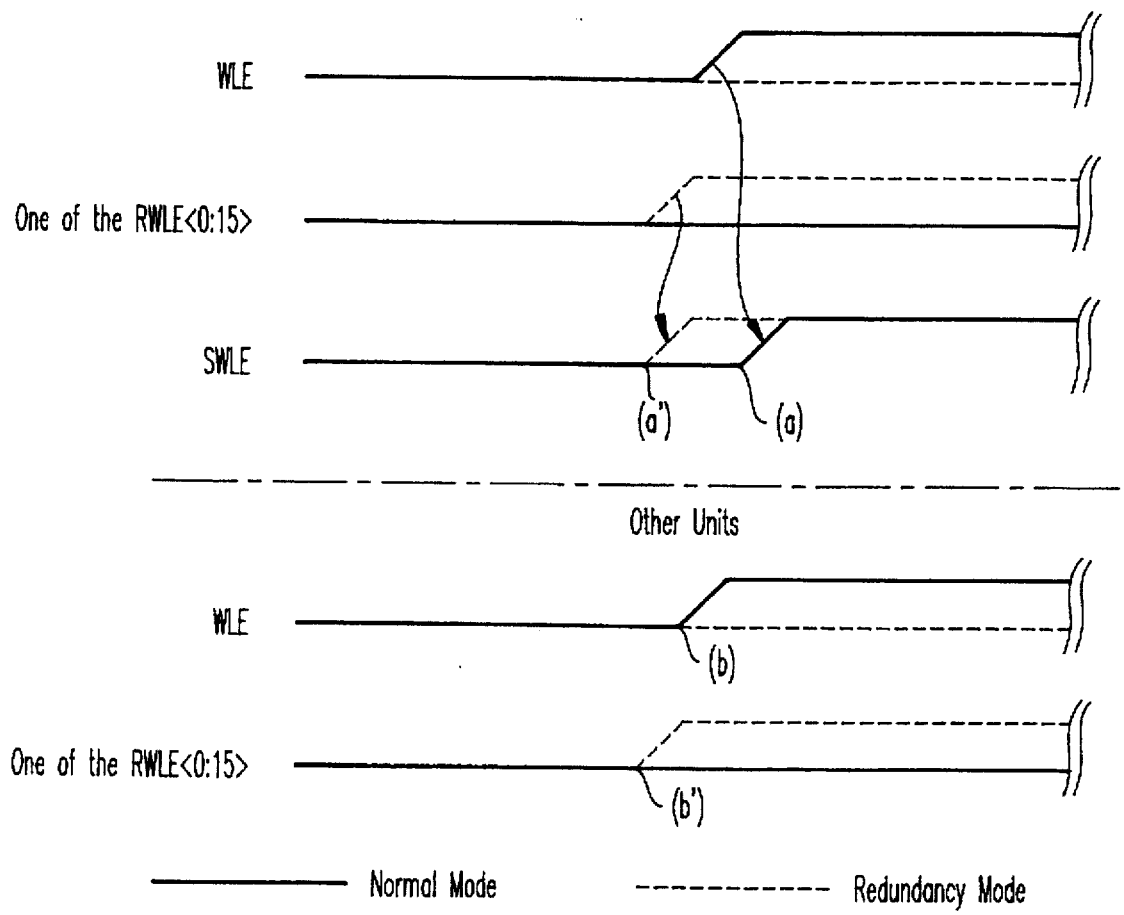
FIG. 20 is a timing diagram showing the operation of the SWLE generator of FIG. 19.

A sample wordline (SWL), which simulates WL rising/ falling delays, gives an ideal timing for the bitline sense Operation. It is important to set SWL at a time that WL is set. FIG. 19 shows the existing SWLE generator to set SWL in the form of OR gate 191. With reference to FIG. 20, when either WLE or RWLE rises, SWLE rises to set SWL. There is, however, a concern. The time at which SWLE sets SWL depends on whether the chip is in normal mode or redundancy mode. This SWLE timing change may cause a potential timing problem depending on the access mode, resulting in reliability problems. The concern becomes significant if one SWLE is shared with other units to save power dissipation, because the time (a) or (a') at which SWLE sets SWL is completely independent of the time (b) at which WLE sets WL (or the time (b') at which RWLE sets RWL) in other units, resulting in insufficient signal development time for some cells.

Figure 21:
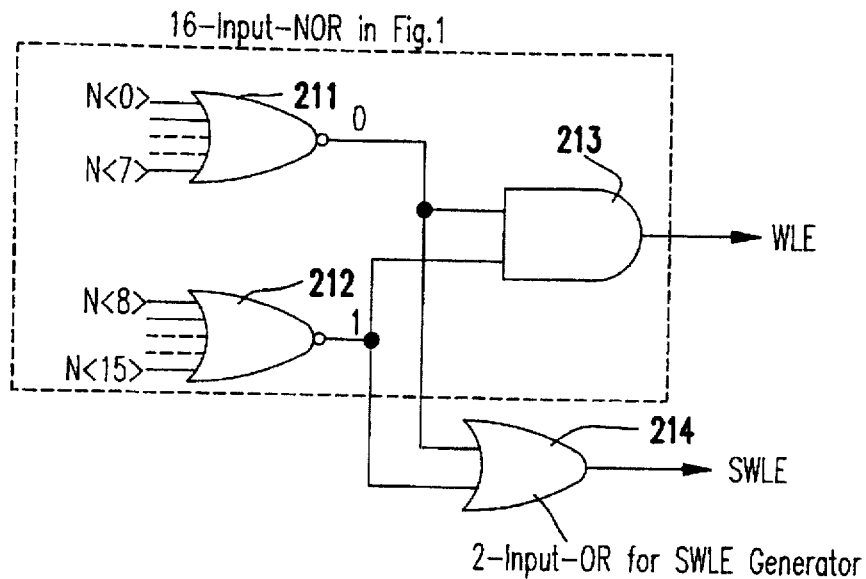
FIG. 21 is a logic diagram of the SWLE generator with row redundancy match detection.
Figure 22:
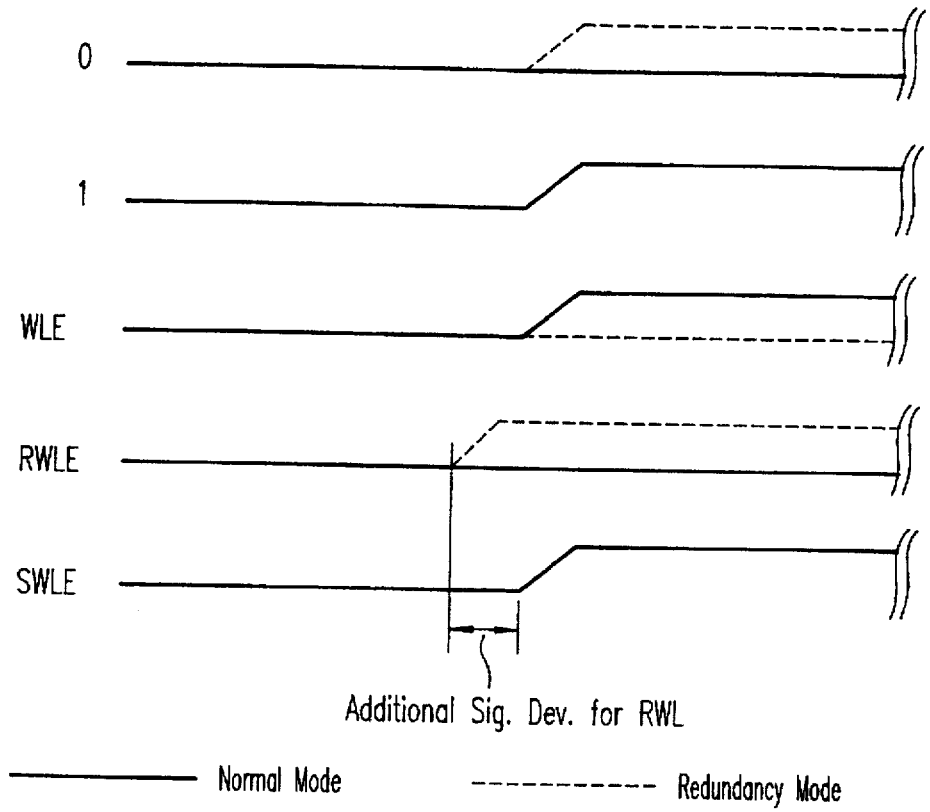
FIG. 22 is a timing diagram showing the operation of the SWLE generator of FIG. 21.

FIG. 21 shows the SWLE generator according to the invention, where two 8-input NOR gates 211 and 212 and one AND gate 213 compose the 16-input NOR WLE generator. A SWLE signal is given by using row redundancy match detection. One two-input OR gate 214 allows the time at which SWLE sets SWL to be the same as the time at which the WLE signal sets the wordline (WL). The time at which SWLE sets SWL remains consistent regardless of mode (normal or redundancy), eliminating the existing reliability concern. This two-input OR combined with row redundancy match detection works as an ideal sample wordline enable generator. As shown in FIG. 22, the time at which SWLE sets SWL is the same as the time at which WLE sets WL. The signal SWLE can accordingly set SWL without using RWLEs even in a redundancy mode, because either node 0 or 1 rises. Note that only one RRDN can detect a redundancy mode in each RAS cycle. Consequently, the time at which SWLE sets SWL is consistent regardless of the mode (normal or redundancy), while tracking the delay for the redundancy detection. The time at which RWLE set the corresponding RWL in the redundancy mode is earlier than the time at which WLE sets WL in the normal mode because RWLE is directly activated by the corresponding RDDN circuit. SWLE sets SWL later than RWLE (the set time of SWLE is the same as the set time of WLE in the normal mode). This should not be a problem (or may be an advantage), because this increases the signal development time for the row redundancy cells.

Figure 23:
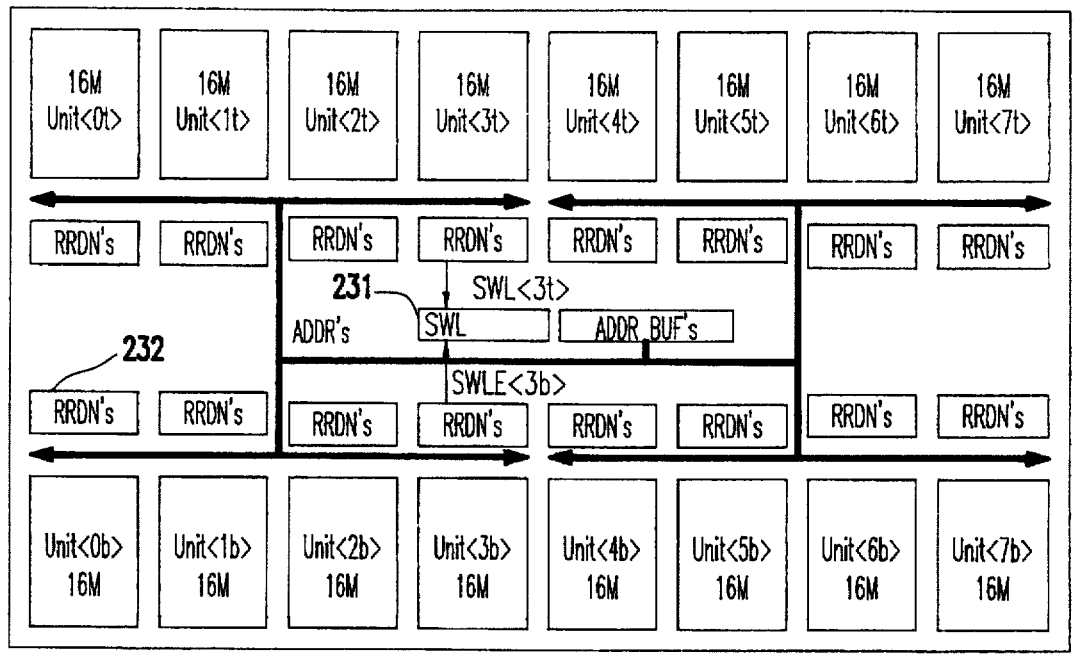
FIG. 23 is a block diagram of the split global bus architecture of FIG. 4 modified with one sample wordline (SWL) in the center of the chip and shared with other 16-Mb units.

One SWL 231 is designed in the center of the chip and shared with other 16-Mb units as shown in FIG. 23. Sixteen RRDNs 232 in the unit are used for the SWLEt (top) and SWLEb (bottom) generators using the circuit described above. Note that these units are the slowest redundancy match detection points in the chip. SWL is set when either SLWEt or SWLEb is activated.

Figure 24:
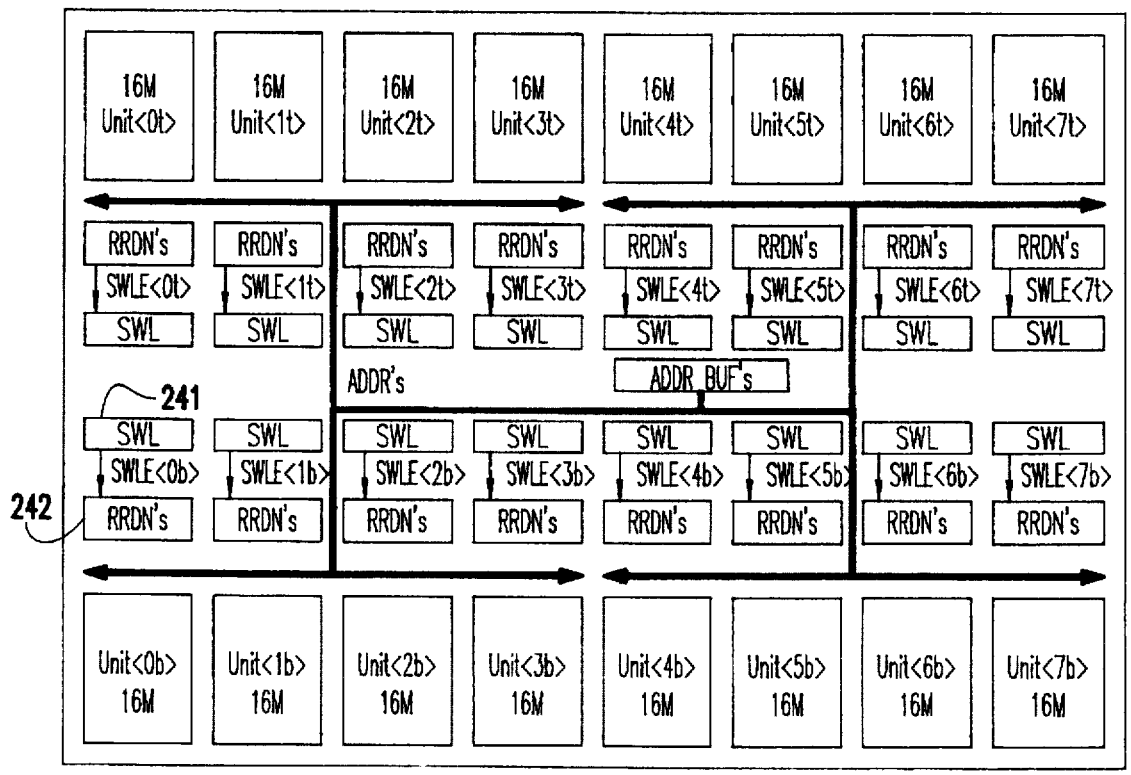
FIG. 24 is a block diagram of the split global bus architecture of FIG. 4 modified with one SWL in each 16-Mb unit.

One SWL 241 is designed in each 16-Mb unit as shown in FIG. 24. SWLE is generated by using sixteen RDDNs 242 in each unit. This architecture has an additional advantage that SWLE sets SWL, while tracking the address wiring delay.

While the invention has been described in terms of preferred embodiments, those skilled in the art will recognize that the invention can be practiced with modification within the spirit and scope of the appended claims. It will be appreciated that the purposes of the present invention have been met; specifically to provide an ideal arrangement for redundancy-match-detection-decoders to reduce the design space, to allow fast and reliable redundancy-match-detection, and to realize a fast and reliable sample wordline enable generator using redundancy-match-detection post decoders.

Having thus described our invention, what we claim as new and desire to secure by Letters Patent is as follows:

1. A random access memory redundancy block architecture comprising:

a memory array, said memory array being divided into two halves, each said half including a plurality of memory units, each said memory unit including a primary wordline block, a redundancy wordline block and a row redundancy control circuit;

a split-global-bus with local row redundancy wires, each said half of said memory array having a global bus on one side;

a local bus between said global busses;

a plurality of distributed wordline enable decoders, one for each of said memory units; and half-length-one-way row redundancy-distributed wordline-enable-signal wires connecting said distributed wordline enable decoders to said split-global-bus, said half-length-one-way row redundancy-distributed wordline-enable-signal wires allowing space in which said distributed wordline enable decoders are fabricated.

2. The random access memory redundancy block architecture recited in claim 1 wherein the redundancy control circuit for each said memory unit is located at a bottom of the memory unit.

3. The random access memory redundancy block architecture recited in claim 2 wherein the redundancy control circuit for each said memory unit has two or more even row redundancy decoders, each said decoder generates a corresponding row redundancy enable signal and controls a corresponding row redundancy wordline in row redundancy wordlines in the row redundancy block of the memory unit.

4. The random access memory redundancy block architecture recited in claim 3 wherein at least two row redundancy decoders are horizontally arranged along a wordline direction.

5. The random access memory redundancy block architecture recited in claim 4 wherein redundancy wordlines in the redundancy wordline block are interleaved with half said redundancy wordlines driven from a left side of the redundancy wordline block and half said redundancy wordlines driven from a right side of the redundancy wordline block.

6. The random access memory redundancy block architecture recited in claim 5 wherein redundancy decoders in a left half of the redundancy wordline block are assigned for the row redundancy wordline in a left half of the redundancy wordline block and decoders in a right half of the redundancy wordline block are assigned for the row redundancy wordline in a right half of the redundancy wordline block.

7. The random access memory redundancy block architecture recited in claim 6 wherein row redundancy enable signals in the left half of the row redundancy control block are wired to control corresponding row redundancy wordlines in the left half of the redundancy wordline block and row redundancy enable signals in the right half of the row redundancy control block are wired to control corresponding row redundancy wordlines in the right half of the redundancy wordline block so as to leave unused wiring space for other purposes in a central portion of the redundancy wordline block.

8. The random access memory redundancy block architecture recited in claim 5 wherein said distributed wordline enable decoders comprise at least one decoding stage generating wordline enable signals, each said stage having corresponding sub-decoders which decode at least two sub-wordline enable signals, the decoded result of each sub-wordline enable signal being input to a next stage of the decoder, thereby reducing parallel wires of the sub-wordline enable generators.

9. The random access memory redundancy block architecture recited in claim 8 wherein the sub-decoders are centrally located so as to reduce wiring lengths.

10. The random access memory redundancy block architecture recited in claim 8 wherein row redundancy enable signals in the left half of the row redundancy control block are wired to control corresponding row redundancy wordlines in the left half of the redundancy wordline block and row redundancy enable signals in the right half of the row redundancy control block are wired to control corresponding row redundancy wordlines in the right half of the redundancy wordline block so as to leave unused wiring space in a central portion of the redundancy wordline block, the sub-decoders being located this central portion so as to reduce wiring lengths.

11. The random access memory redundancy block architecture recited in claim 1 wherein said memory units in each said half of said memory array are arranged in parallel to form a bank in which address bus lines are shared with all the redundancy block bus.

12. The random access memory redundancy block architecture recited in claim 1 wherein the row redundancy control circuit for each said memory unit comprises:

a plurality of fuse latch circuits each receiving addresses from a global address bus, said fuse latch circuits generating outputs corresponding to whether a fuse exists or is blown;

a plurality of NOR gates connected to receive outputs from corresponding groups of fuse latch circuits and generating decoded output signals;

a plurality of AND gates, each connected to an output of a corresponding one of said plurality of NOR gates, said plurality of AND gates being enabled to generate redundancy wordline enable signals; and a logic circuit connected to receive the decoded output signals from said plurality of NOR gates and generating a wordline enable signal whereby redundancy match detection is accomplished completely as an address driven circuit thereby eliminating an illegal normal/redundancy access problem caused by address versus timing skew.

13. The random access memory redundancy block architecture recited in claim 12 wherein said plurality of AND gates are enabled by adjacent decoded output signals from said plurality of NOR gates acting as a timing generator, minimizing timing skew.

14. The random access memory redundancy block architecture recited in claim 12 wherein the logic circuit comprises:

first and second NOR gates connected to receive first and second groups of decoded output signals from said plurality of NOR gates; and an AND gate connected to receive outputs from said first and second NOR gates to generate said wordline enable signal.

15. The random access memory redundancy block architecture recited in claim 14 further comprising:

a two-input OR gate for each said row redundancy control circuit connected to receive the outputs of said first and second NOR gates and generating a sample wordline enable signal; and a sample wordline circuit responsive to the sample wordline enable circuits, said sample wordline circuit being set at a time when the wordline enable sets the wordline signal regardless of normal or redundancy mode, while tracking a delay for redundancy match operation.

16. The random access memory redundancy block architecture recited in claim 15 wherein said sample wordline circuit is located in a center of a chip on which the random access memory is implemented.

17. The random access memory redundancy block architecture recited in claim 15 wherein said sample wordline circuit is a distributed circuit incorporated into the row redundancy control circuit for each said memory unit.

* * * * *